(12) United States Patent
Ehrmann et al.

(10) Patent No.: US 10,028,384 B2
(45) Date of Patent: Jul. 17, 2018

(54) CIRCUIT BOARD ASSEMBLY, CONTROL DEVICE FOR A COOLER FAN MODULE AND METHOD

(71) Applicant: Brose Fahrzeugteile GmbH & Co. KG, Wuerzburg, Wuerzburg (DE)

(72) Inventors: Steffen Ehrmann, Aub (DE); Stefan Zick, Volkach (DE)

(73) Assignee: BROSE FAHRZEUGTEILE GMBH & CO. KG, WUERZBURG, Wuerzburg (DE)

( * ) Notice: Subject to any disclaimer, the term of this patent is extended or adjusted under 35 U.S.C. 154(b) by 68 days.

(21) Appl. No.: 14/910,712

(22) PCT Filed: Aug. 7, 2014

(86) PCT No.: PCT/EP2014/066962
§ 371 (c)(1),
(2) Date: Feb. 8, 2016

(87) PCT Pub. No.: WO2015/018881
PCT Pub. Date: Feb. 12, 2015

(65) Prior Publication Data
US 2016/0192493 A1    Jun. 30, 2016

(30) Foreign Application Priority Data

Aug. 7, 2013 (DE) .................. 10 2013 215 588

(51) Int. Cl.
*H05K 1/02* (2006.01)
*H05K 1/11* (2006.01)
(Continued)

(52) U.S. Cl.
CPC .......... *H05K 1/181* (2013.01); *H03K 17/567* (2013.01); *H03K 17/687* (2013.01); *H05K 1/021* (2013.01);
(Continued)

(58) Field of Classification Search
CPC ...... H05K 1/181; H05K 1/021; H05K 3/3452; H05K 1/119; H05K 1/111;
(Continued)

(56) References Cited

U.S. PATENT DOCUMENTS 3,457,639 A * 7/1969 Weller .................... H01L 24/81
228/180.21
4,913,285 A * 4/1990 Tsutsumi ............... H01H 13/06
200/306
(Continued)

FOREIGN PATENT DOCUMENTS

DE         19912443 A1 * 10/2000 ............. H01L 23/36
DE  10 2008 013 226 A1    9/2009
(Continued)

OTHER PUBLICATIONS

International Search Report and Written Opinion for International Application No. PCT/EP2014/066962, dated Nov. 6, 2014, 9 pages.
(Continued)

*Primary Examiner* — Steven T Sawyer
*Assistant Examiner* — Yahya Ahmad
(74) *Attorney, Agent, or Firm* — Westman, Champlin & Koehler, P.A.

(57) ABSTRACT

The present invention relates to a circuit board assembly, comprising a circuit board which has a first and a second solder region, which is galvanically separated from the first, and which furthermore has a separator arranged between the solder regions and rising out from the solder regions, having a power semiconductor component which has a housing having an output connection side, from which at least one control connection and a plurality of output connections protrude, which are arranged substantially adjacent to each other on the output connection side, wherein the control connection is electrically and mechanically connected to the
(Continued)

first solder region and the output connections are electrically and mechanically connected to the second solder region and the control connection is separated from the output connections via the raised separator. The present invention furthermore relates to a control device for a cooler fan module of a motor vehicle and a method for assembling a power semiconductor component on a circuit board.

15 Claims, 5 Drawing Sheets

(51) Int. Cl.
    *H05K 1/18*     (2006.01)
    *H05K 3/34*     (2006.01)
    *H03K 17/567*     (2006.01)
    *H03K 17/687*     (2006.01)
    *H05K 3/20*     (2006.01)

(52) U.S. Cl.
    CPC ............. *H05K 1/111* (2013.01); *H05K 1/119* (2013.01); *H05K 3/3452* (2013.01); *H05K 3/202* (2013.01); *H05K 2201/066* (2013.01); *H05K 2201/09118* (2013.01); *H05K 2201/09909* (2013.01); *H05K 2201/10166* (2013.01); *H05K 2201/10969* (2013.01); *Y02P 70/611* (2015.11)

(58) Field of Classification Search
    CPC ... H05K 2201/066; H05K 2201/09118; H05K 3/202; H05K 2201/09909; H05K 2201/10166; H05K 2201/10969; H03K 17/687; H03K 17/567; Y02P 70/611
    USPC .................................. 361/709, 760; 29/832
    See application file for complete search history.

(56) References Cited

U.S. PATENT DOCUMENTS

| | | | | |
|---|---|---|---|---|
| 5,421,081 | A | * | 6/1995 | Sakaguchi ............ H05K 1/113 156/256 |
| 8,809,082 | B2 | | 8/2014 | Grotsch et al. |
| 2001/0045777 | A1 | * | 11/2001 | Onizuka ................ H05K 1/144 307/10.6 |
| 2003/0174477 | A1 | * | 9/2003 | Ohtani .............. H01L 23/49861 361/760 |
| 2004/0190272 | A1 | * | 9/2004 | Takagi ................... H05K 3/202 361/775 |
| 2005/0263318 | A1 | * | 12/2005 | Yoshioka ............. H05K 1/0206 174/252 |
| 2007/0001297 | A1 | * | 1/2007 | Higasa .................. H05K 1/111 257/723 |
| 2009/0218122 | A1 | * | 9/2009 | Fukase ..................... H05K 3/28 174/261 |
| 2012/0107973 | A1 | * | 5/2012 | Grotsch ............... H01L 33/483 438/26 |

FOREIGN PATENT DOCUMENTS

| | | |
|---|---|---|
| EP | 0 908 943 A2 | 4/1999 |
| EP | 2 544 234 A1 | 1/2013 |
| WO | 90/04912 A1 | 5/1990 |
| WO | WO 9004912 A1 * | 5/1990 ........... H05K 3/3421 |

OTHER PUBLICATIONS

German Search Report for German Patent Application No. 10 2013 215 588.3, dated Jul. 15, 2014, 5 pages.

* cited by examiner

CIRCUIT BOARD ASSEMBLY, CONTROL DEVICE FOR A COOLER FAN MODULE AND METHOD

CROSS-REFERENCE TO RELATED APPLICATION

This Application is a Section 371 National Stage Application of International Application No. PCT/EP2014/066962, filed 7 Aug. 2014 and published as WO 2015/018881 A1 on 12 Feb. 2015, in German, the contents of which are hereby incorporated by reference in their entirety.

FIELD OF THE INVENTION

The present invention relates to a circuit board assembly. The present invention also relates to a control device for a cooling fan module of a motor vehicle and to a method for mounting a power semiconductor component on a circuit board.

TECHNICAL BACKGROUND

A circuit board, which is often referred to as a PCB (printed circuit board), is a support for electrical and electronic components. It is used for mechanically fastening and electrically connecting electrical and electronic circuit components. Separate components, such as power (semiconductor) components, may be arranged on circuit boards in addition to more or less complex analogue and digital integrated circuits. In power electronics, power semiconductor components are designed for controlling and switching high electrical currents and/or voltages.

A requirement for reliable operation of these power semiconductor components is that heat produced during operation is dissipated. The heat energy generated is usually conducted to a heat sink which is provided in the housing of the power semiconductor component and emits the energy to the environment via the outside of the housing. It is essential for the cooling that this heat sink is thermally coupled to the circuit board or that a heat sink is provided on the circuit board. If heat energy generated is not effectively dissipated, it may lead to heat accumulation on the circuit board and in the component.

As a result, the power semiconductor components used may rapidly degrade in an undesired manner, and this may lead to the functional impairment or the malfunction of the power semiconductor component.

When using such leadframes as heat sinks for dissipating the heat energy generated, power semiconductor components may be soldered directly to the leadframe by the external terminals thereof. Here, the leadframe carries out both the function of low-resistance current conduction and the heat distribution and dissipation for effectively cooling the power semiconductor component.

Such power semiconductor components often only have one single power output terminal, via which the power current for operating the load is conducted to the outside. This output terminal is electrically and mechanically connected to the contact surface arranged on the circuit board by means of a single soldered joint. Since this soldered joint has a relatively small cross section, a relatively high level of power loss is produced at this narrow point which is caused by the resistance produced there, which power loss ultimately heats both the output terminal and the soldered joint to a greater or lesser extent. The higher the output current generated by the power semiconductor component for switching or operating the load and/or the lower this effective cross section of the output terminals, the higher the resistance and the associated level of heating caused by the power loss.

For this reason, primarily in power semiconductor components that are designed for high output currents, a plurality of output terminals are used in order to increase the effective cross section for the output current and thus to reduce the resistance caused by the output terminal. As a result, however, mounting on a leadframe is more difficult.

One aspect of the mounting consists in placing the power semiconductor components that are provided with a plurality of output terminals on the contact terminals available for this purpose in a targeted manner. While this is still relatively simple for just one output terminal and one control terminal, it becomes increasingly difficult for a plurality of output and control terminals, in particular if the output terminals and the control terminal are arranged directly beside one another and the respective contact surfaces and the distance between the output and control terminal are relatively small.

A further aspect consists in that a larger amount of solder material is required on the contact surface for contacting the plurality of output terminals. As a result, there is the additional risk that solder material will overflow from the contact surface for the output terminals onto the contact surface for the control terminal, in particular if the two contact surfaces are arranged very close to one another. Owing to said material running together, an undesired short circuit is produced between the contact terminals, as a result of which the power semiconductor component will become inoperative.

SUMMARY OF THE INVENTION

Against this background, the problem addressed by the present invention is to provide a power semiconductor component that can be mounted on a circuit board more easily.

This problem is solved according to the invention by a circuit board assembly having the features of claim 1 and/or by a control device having the features of claim 14 and/or by a method having the features of claim 15.

Accordingly, a circuit board assembly is provided, comprising a circuit board which comprises a first soldering region and a second soldering region that is galvanically isolated therefrom and further comprises a separating web which is arranged between the soldering regions and is raised up from the soldering regions, comprising a power semiconductor component, which comprises a housing having an output terminal side, from which at least one control terminal and a plurality of output terminals which are arranged substantially beside one another on the output terminal side project, the control terminal being electrically and mechanically connected to the first soldering region and the output terminals being electrically and mechanically connected to the second soldering region, and the control terminal being separated from the output terminals by the raised separating web.

In this context, electrically means that there is an electrical contact between the relevant terminal and the soldering region. In this context, mechanically means that there is a soldered contact between the relevant terminal and the soldering region.

In this case, the first soldering region forms a control terminal, via which the control signals can be coupled into the power semiconductor component. The second soldering region forms an output terminal, via which a load which is connected to the power semiconductor component and is operated thereby, for example an electric motor, a cooling fan motor, a rectifier circuit, an inverter circuit and the like, is operated.

The concept underlying the present invention consists in providing, between the soldering regions provided for the control terminals and output terminals of the power semiconductor components, a separating web intended specifically therefore. This separating web is raised up from the respective surfaces of the soldering regions such that it acts as a flow barrier and thus prevents the solder material applied to the first or second soldering region from being able to come into contact with the other soldering region. In this way, the separating webs effectively prevent the soldering regions which are adjacent to one another by means of the separating webs from flowing together.

Generally, soldering a plurality of output terminals arranged beside one another to the same soldering surface is particularly complex if these output terminals are arranged very close to one another, if the soldering surfaces are accordingly small and/or if the spacing of the soldering surfaces is very small. Providing the separating webs gives an effective barrier, and this significantly simplifies in particular positioning and soldering.

Since the solder can be prevented from flowing together between the first and second soldering region in this very simple but nevertheless very effective way, a short circuit caused thereby does not occur between the control terminal and the output terminals either, which would directly lead to a malfunction of the corresponding power semiconductor components. The reject rate caused thereby is reduced, as a result of which power semiconductor components arranged on circuit boards can be produced more cost-effectively.

Advantageous embodiments and developments are found in the additional dependent claims and in the description with reference to the figures of the drawings.

In a particularly preferred embodiment, at least one of the output terminals is shortened. This output terminal is referred to as a dummy output terminal and is, unlike the remaining output terminals, both electrically and mechanically decoupled from the second soldering region. The dummy output terminal can be shortened in various ways, for example as early as during production of the power semiconductor component. However, it is particularly preferable for the dummy output terminal to be designed to be broken off, cut off, punched out, detached, bent away or the like. The advantage is that the dummy output terminal can also be produced retrospectively, i.e. after the power semiconductor components are manufactured, so that conventional power semiconductor components having output terminals arranged beside one another and control terminals can be used and the dummy output terminal is only converted subsequently by shortening.

In a particularly preferred embodiment, the dummy output terminal(s) is/are arranged so as to be adjacent to the control terminals. When mounted, the dummy output terminal is in the region of the separating web. Typically, only a single shared control terminal is provided, which is also arranged on an outer side of the row of output terminals. In this case, the dummy output terminal(s) form(s) the isolation between the control terminals and the remaining output terminals to an extent.

In a preferred embodiment, the separating web which is raised up from a surface of the soldering regions has a width which corresponds at least to the width of the shortened dummy output terminal(s). In this way, it is possible for to be spaced apart from the separating webs in the vertical direction in the mounted state in which the control terminals and the remaining output terminals are soldered to the corresponding soldering regions. The separating web thus defines a space between these control terminals and output terminals. Typically, the separating web has a width in the range of from 0.1 mm to 2 mm, preferably a width that corresponds to the width of the leadframe, that is to say 0.5 mm to 1.0 mm.

In an additional or alternative embodiment, the separating web has a height which is selected to be at least high enough that a solder applied to at least one of the soldering regions cannot flow onto the other soldering region in the viscous state. The selected height of the separating web depends in particular on the amount of solder applied to the soldering regions and/or on the viscosity of the solder when in the heated state. Preferably, the separating web has a height in the range of from 0.1 mm to 2 mm, in particular a height in the range of from 0.5 mm to 0.8 mm.

In a preferred embodiment, the circuit board comprises a support region that is separated from the first and second soldering region by another separating web. This support region serves to support the housing or the heat sink of the power semiconductor component, which is typically also attached at this point. Preferably, this support region also serves as an additional contact terminal, which for example serves as a terminal for a reference potential of the power semiconductor component.

In a development, a large-area cooling layer is arranged on an underside of the housing and may for example be designed as a planar layer or panel which extends over the entire underside. This cooling layer is thermally coupled to the component(s) in the housing. This cooling layer, which is electrically and/or mechanically fastened to the support region, aims to emit heat which is generated by the components inside the housing during operation to the outside. Depending on the power class of the components arranged in the housing, i.e. depending on what current is switched by these components, a correspondingly high power is switched, as a result of which dissipated heat is generated. This dissipated heat is conducted away to the outside via the cooling layer by the components, in order to ensure the functionality of the power semiconductor component. Preferably, this cooling layer is coupled to a thermally conductive material applied to the circuit board or present in the circuit board, which material makes it possible to effectively transfer the heat.

In another, particularly preferred embodiment, the circuit board comprises an electrically conductive leadframe which spans the first and second soldering regions. When the first and second soldering regions of the leadframe are contacted by the corresponding control terminals or output terminals, a low-resistance connection is made possible thereby. It is essential that the first and second soldering regions of the leadframe are electrically isolated from one another. It is particularly preferable for the support region to also be a component of the leadframe. In this case, to an extent, the leadframe itself forms the heat sink for cooling the power semiconductor component that is fastened thereto. In addition, it may be provided that this support region forms a third contact terminal, which is coupled for example to a reference potential, for example to the ground potential.

The leadframe is preferably made of highly conductive metal at least in part, which thus has very high thermal conductivity and very high electrical conductivity.

Preferably, in addition to its function of heat dissipation, the cooling layer may also have the function of an electrical contact terminal, provided that it is electrically conductive.

It is particularly preferable for the cooling layer, which is for example provided on an underside of the housing, to form the third contact terminal (e.g. drain) of the power semiconductor component, to which for example a reference potential is applied.

In a likewise preferred embodiment, the separating webs are produced by overmoulding the leadframe using an electrically insulating material, in particular plastics material. The leadframe is overmoulded using an electrically insulating, temperature-resistant thermoplastic polymer, in particular PPS (polyethylene sulfide). It is particularly preferable for the entire leadframe, with the exception of the soldering regions, support regions, corresponding connecting lines and the like, to be overmoulded using plastics material, in order to produce the circuit board in this way.

In a preferred embodiment, the soldering regions are dimensioned in terms of their length and width, therefore their soldering surface, such that the control terminal can be placed on and fastened to the first soldering region by its support surface and the output terminals can be placed on and fastened to the second soldering region by their support surfaces. The support surfaces designate the regions of the control terminals and output terminals at which said terminals come into mechanical contact with the respective soldering regions when mounted. The first and second soldering regions are therefore dimensioned in terms of their support surfaces such that they are at least larger than a surface which results from projecting the support surfaces of the control terminals and the output terminals. It is thus always ensured that all the control terminals and output terminals can be positioned on the soldering regions provided therefore for the purpose of producing a soldered joint.

In a typical embodiment, an SMD housing is provided as a housing type for surface mounting the power semiconductor component. This planar SMD housing has four outer sides, of which only one forms the output terminal side. The pins forming the control terminals and output terminals project on this output terminal side in order to be positioned on the soldering regions. The SMD housing may for example be designed as a TO262 housing or a 7-pin TO263 housing. For example, in a power semiconductor component designed as a 7-pin TO263 housing, a total of six or seven pins project on the output terminal side, of which one pin forms the control terminal and the remaining pins form the output terminals. The dummy output terminal can be produced in a very simple manner by breaking off or removing one of these output terminals.

A power semiconductor component typically comprises one or more components provided in the housing. In a particularly preferred embodiment, the power semiconductor component is designed as a power switch, which in particular contains a component that is designed as a power MOSFET, IGBT, thyristor or TRIAC. Such power switches are designed for switching high currents and voltages, and therefore for switching high levels of power. In particular, power MOSFET and IGBT components are suitable for switching high levels of power at high clock frequencies owing to their semiconductor structure.

In a particularly preferred embodiment, a plurality of components are provided in the housing which, on the control side, can each be simultaneously actuated by the shared control terminal. These components, which are for example designed as power switches, each have a load output and are connected in parallel in order to generate a high output current. The particular advantage of such components which are arranged in parallel in terms of their outputs consists in that a plurality of comparatively low-power power switches which can switch a higher power by being connected in parallel may be provided for a power to be switched. This is advantageous in terms of heat since the individual power switches do not overheat. In addition, in this way power switches having lower power classes can be used, which are typically more cost-effective than a single more powerful power switch or few more powerful power switches. It is particularly preferable for a number of power switches or components to be used that corresponds to the number of output terminals. In this case, each power switch or component could be connected to a separate output terminal by its load output. It would, however, also be conceivable for the load outputs of the various components or power switches to still be combined within the housing and then to be coupled to the various output terminals. This would have the advantage that any output terminal can be removed subsequently in a simple manner, without this impairing the functionality of the various power switches or components.

In a likewise preferred embodiment, a single control terminal is provided. This single control terminal is preferably arranged on an outer side of the pins, which are arranged beside one another and consist of control terminals and output terminals. Therefore, in this way a minimum of just one dummy output terminal needs to be provided in order to separate the control terminal from the remaining output terminals.

In a particularly preferred embodiment of the method according to the invention, a corresponding solder material is applied to the first and second soldering region before the control terminal and output terminals are soldered on. In this way, reflow soldering is possible. The term reflow soldering refers to a soft-soldering method that is common in electrical engineering for soldering SMD components. Here, in a first step a soft solder in the form of a solder paste is applied to the circuit board before the components are fitted, for example by means of screen printing, a dispenser, by preformed parts or galvanically. In a subsequent step, the power semiconductor components are then positioned on the circuit board. The use of the solder paste is advantageous in that it is somewhat adhesive, and therefore the components adhere directly to the paste when they are being fitted. They therefore do not need to be separately attached or affixed. In a third step, the remaining solder is melted on in order to achieve a rigid, bonded connection between the components and the circuit board. When melting on said solder, the fitted components are centred on the soldering regions by surface tension themselves and are raised up.

The above embodiments and developments can be combined with one another in any practical way. Further possible embodiments, developments and implementations of the invention also include combinations of features of the invention that are described above or below with regard to embodiments, even if these combinations are not mentioned explicitly. In particular, a person skilled in the art will here also add individual aspects as improvements or additions to the relevant basic form of the present invention.

CONTENT OF THE DRAWINGS

The present invention is explained below in greater detail with reference to the embodiments specified in the schematic figures of the drawings, in which.

Figure 1:
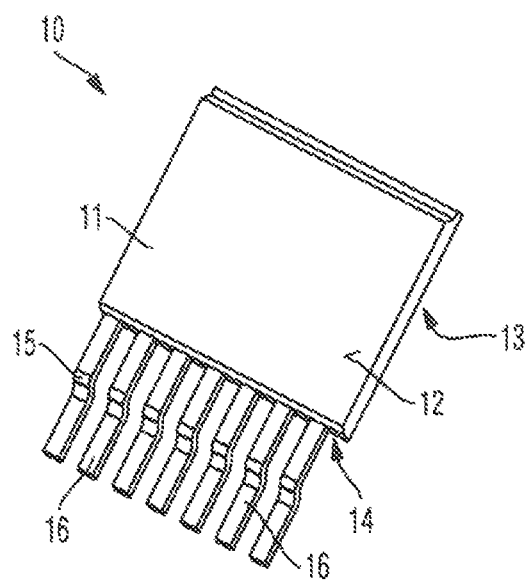
FIG. 1 is a perspective view of a power semiconductor component.

The accompanying drawings are intended to provide greater understanding of the embodiments of the invention. They illustrate embodiments and are used in conjunction with the description to explain principles and concepts of the invention. Other embodiments and many of the stated advantages are apparent from the drawings. The elements in the drawings are not necessarily shown to scale.

In the figures of the drawings, the same elements, features and components, or those serving the same function and having the same effect, are provided with the same reference signs in each case, unless otherwise specified.

DESCRIPTION OF EMBODIMENTS

FIG. 1 is a perspective view of a power semiconductor component. The power semiconductor component is provided with reference sign 10 here. The power semiconductor component 10 comprises a housing 11, which has an upper side 12 and an underside 13 (not visible in FIG. 1) which is arranged opposite said upper side. In addition, the power semiconductor component 10 comprises four sides, one of which forms an output terminal side 15. The power semiconductor component 1 shown in FIG. 1 is an SMD component, which comprises a TO263 housing having six pins 15, 16 on the output terminal side 14 and one terminal is designed as a cooling surface 13. In this case, one of these pins forms the control terminal 15 and the remaining pins form the output terminals 16.

It is assumed that a power switch designed as a MOSFET is provided in the interior of the power semiconductor component 10, which switch thus comprises a control terminal (gate) and two outputs (drain, source). It is assumed that the control terminal 15 is connected to the gate terminal of the power MOSFET 10. The output terminals 16 are connected to the source or drain terminal of the power MOSFET, which functions as a load output. It is also assumed that the underside of the power MOSFET 10 forms a large-area, electrically conductive contact surface, which is connected to the source or drain terminal of the power MOSFET 10 in the interior of the housing 11.

Figure 2:
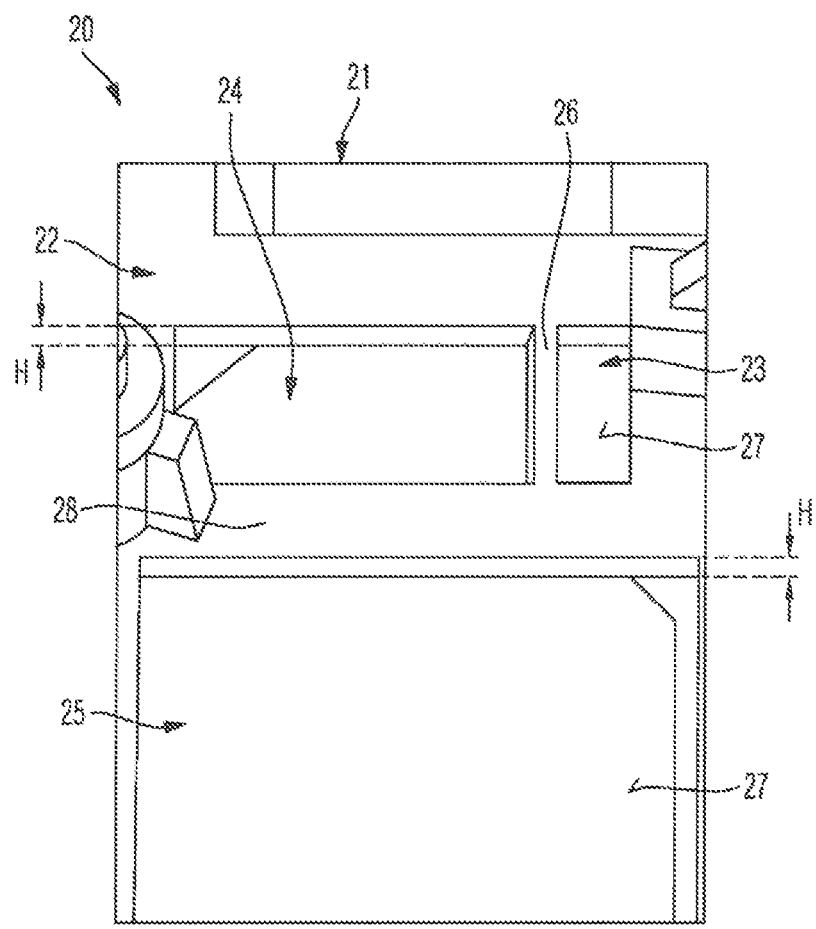
FIG. 2 is a detail of a circuit board according to the invention comprising first and second soldering regions.

FIG. 2 shows a detail of a circuit board, which is provided with reference sign 20 here.

The circuit board 20 shown in FIG. 2 comprises a leadframe 21, which is overmoulded in part using a plastics material 22 such that regions of the leadframe 21 are exposed. The plastics material 22 used is preferably made of an electrically non-conductive material and of a material that is of low thermal conductivity or is thermally non-conductive. The plastics material 22 is for example a thermoplastic polymer, such as PPS. The leadframe 21 is preferably made of copper, aluminium or of a conventional metal sheet having a thermally and electrically conductive surface coating.

A first exposed region of the leadframe 21 forms a first soldering region 23 and a second exposed region of the leadframe 21 forms a second soldering region 24. Furthermore, a third soldering region 25 is provided, which is also formed by the leadframe 21. The two soldering regions 23, 24 are arranged so as to be adjacent to one another and are separated from one another by a separating web 26. This separating web 26 is made of plastics material which is overmoulded onto the leadframe 21. The separating web is thus raised up from a surface 27 formed by the leadframe 21. The two soldering regions 23, 24 are furthermore spaced apart from the support region 25 by another separating web 28, this separating web 28 also being raised up from the surface 27. Therefore, in particular all the soldering regions 23, 24 and the support region 25 are completely surrounded by the plastics material 22, so that the soldering regions 23, 24 and the third soldering region 25 form trough-shaped hollows.

Figure 3:
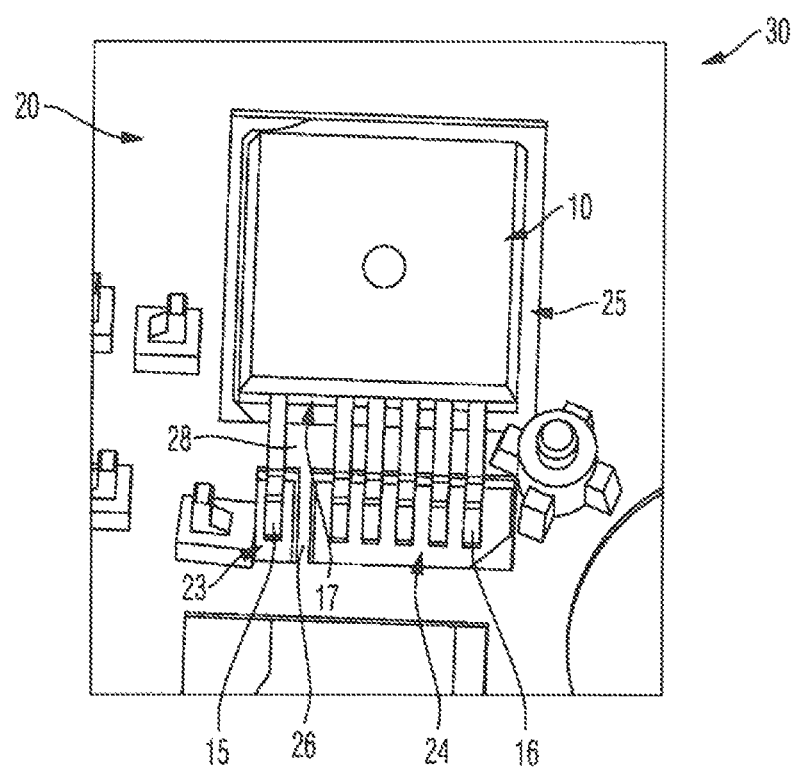
FIG. 3 shows a circuit board assembly according to the invention, in which the semiconductor component from FIG. 1 is mounted on the circuit board from FIG. 2.

FIG. 3 shows a circuit board assembly according to the invention, which is provided with reference sign 30 here.

In the embodiment in FIG. 3, the power semiconductor component 10 from FIG. 1 is fastened to the circuit board 20 from FIG. 2 and is correspondingly electrically contacted. For this purpose, the output terminals 16 are positioned on the second soldering regions 24 and are soldered thereto for the purpose of electrical contacting. The control terminal 15 is positioned on the first soldering region 23 and is soldered thereto for the purpose of electrical contacting. The underside of the housing 11 of the power semiconductor component 10 is soldered in the soldering region 25. Since the underside 13 forms the heat sink 32 (see FIG. 4B) of the power semiconductor component 10, via which heat sink the power semiconductor component is intended to be electrically contacted on one side and via which body heat generated in the interior of the power semiconductor component 10 is intended to be dissipated, a contact connection which has good electrical and thermal conductivity, for example a planar soldered joint, is typically provided here.

According to the invention, one of the output terminals 16 from FIG. 1 is shortened. This is a conventional output terminal 16, which has been cut out, punched out, detached or shortened in another way. This shortened output terminal forms what is known as a dummy output terminal 17, the function of which is explained in the following with reference to FIG. 3.

The power semiconductor component 10 is positioned on the circuit board such that the dummy output terminal 17 is arranged in the region of the separating web 26 in this case, i.e. is positioned directly above the separating web 26. This dummy output terminal 17 thus does not contribute to conducting current from the power semiconductor component 10 towards the second soldering region 24.

Figure 4:
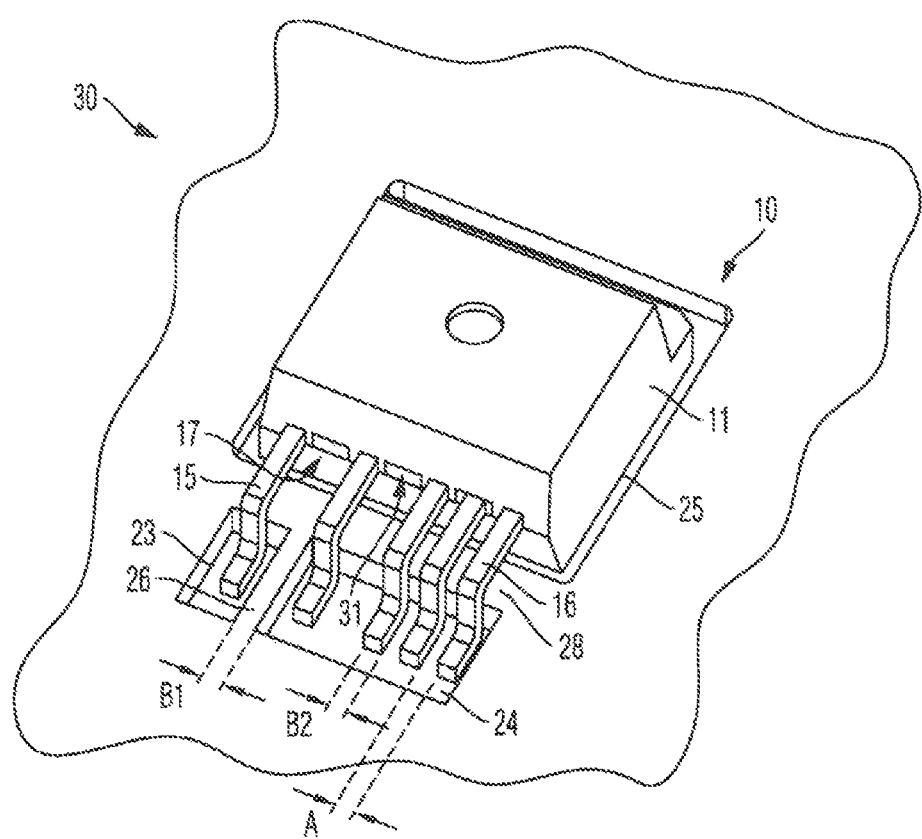
FIG. 4 is a perspective view of a second embodiment of a circuit board assembly according to the invention.
Figure 5:
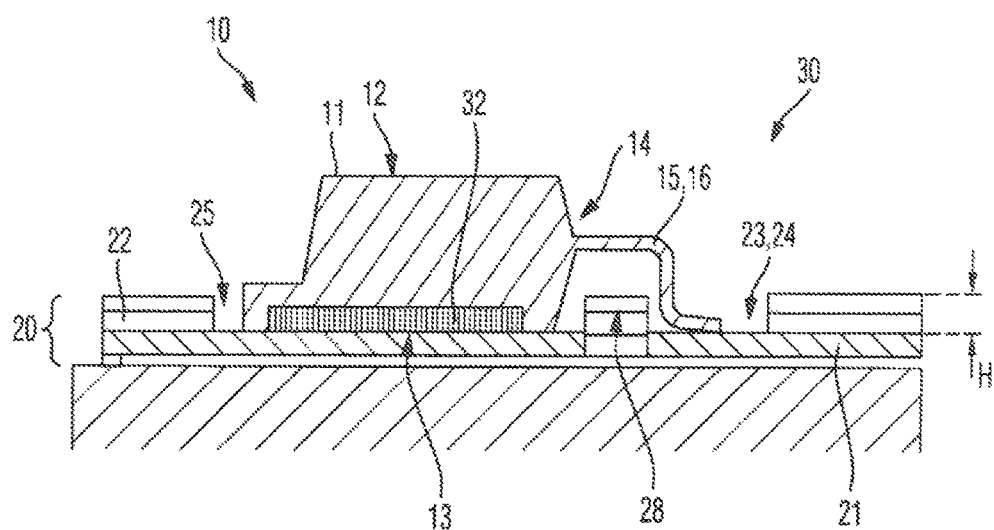
FIG. 5 is a lateral cross-sectional view of a second embodiment of a circuit board assembly according to the invention.

FIGS. 4 and 5 show a perspective view (FIG. 4) and a lateral cross-sectional view (FIG. 5) of a second embodiment of a circuit board assembly according to the invention. By contrast with the above, with reference to the embodiments shown in FIGS. 1 to 3 another output terminal 31 is additionally shortened in the centre of the output pins 16, 17. The shortened output terminal 31 may also be provided in a standard component, since the soldering region may also be used for conducting current. Therefore, the shortened output terminal may be detached in a standard manner, but may be connected to the soldering region.

The separating webs 26, 28 serve the purpose of the solder that is applied in the first and second soldering region 23, 24 not being able to reach the other soldering region 23, 24 during assembly, for example. This risk could in particular arise during a contacting process using the reflow soldering method, in which the output terminals 16 and the control terminal 15 are positioned on the soldering regions 23, 24 and become viscous by heating the solder applied at this point. Without the corresponding separating webs 26, 28, the solder material that has become viscous would be able to reach the corresponding other soldering regions 23, 24 or even the support region 25, and this should, however, be avoided. For this reason, the separating webs 28, 26 are raised up from the surface 27 of the leadframe at least by a height H. This height H is preferably such that soldering material that has become viscous by being heated and is present in the soldering regions 23, 24 cannot reach the adjacent soldering regions 23, 24 or support regions 25.

The separating web 26 in FIG. 3 has a width B1. The width of a pin 15, 16 is provided with reference sign B2. Furthermore, the reference sign A denotes the distance between the control terminal 15 and the output terminal 16 that is adjacent thereto. The width B1 of the separating web 26 is such that it corresponds at least to the width B2 of the dummy output terminal 17 and at most to the distance A between the control terminal 15 and the output terminal 16 that is adjacent thereto.

Although the present invention has been fully described above on the basis of preferred embodiments, it is not limited thereto, but rather may be modified in a number of ways.

The above-described embodiments should be understood as merely illustrative, in particular in terms of the types of circuit board, housing, power semiconductor component, etc. that are used therein. The types of housing and power semiconductor components may also correspondingly be designed differently, in particular as regards the number and arrangement of the output terminals and control terminals. The stated dimensions and quantities are also given merely for the sake of comprehension, and should not limit the invention to that effect. The stated materials, in particular as regards the solder material, plastics material and leadframe material, should be understood to be advantageous examples. Although in the above embodiment the power semiconductor component is designed as a power MOSFET in a preferred embodiment, the invention should not be limited to that effect, but rather may also be extended to power semiconductor components comprising other components.

LIST OF REFERENCE SIGNS

10 Power semiconductor component, power MOSFET
11 Housing
12 Upper side of the housing
13 Underside of the housing
14 Output terminal side
15 Control terminal
16 Output terminals
17 Dummy output terminal
20 Circuit board
21 Leadframe
22 Plastics material
23 First soldering region
24 Second soldering region
25 Support region
26 Separating web
27 Surface of the leadframe or soldering regions
28 Separating web
20 Circuit board assembly
31 Shortened output terminal
32 Cooling layer
A Distance
B1 Width of the separating web
B2 Width of an output terminal
H Height of the separating web

The invention claimed is:

1. A circuit board assembly, comprising:
a circuit board which comprises a first soldering region and a second soldering region that is galvanically isolated therefrom and further comprises a separating web which is arranged between the soldering regions and is raised up from the soldering regions,
a power semiconductor component, which comprises a housing having an output terminal side, from which at least one control terminal and a plurality of output terminals which are arranged substantially beside one another on the output terminal side project, the control terminal being connected to the first soldering region and the output terminals being connected to the second soldering region, and the control terminal being separated from the output terminals by the raised separating web,
wherein at least one dummy output terminal is provided which is shortened compared with the output terminals and is decoupled from the second soldering region, wherein the dummy output terminals are arranged so as to be adjacent to the control terminals and in the region of the separating web,
wherein the circuit board comprises a leadframe, and wherein a first exposed region of the leadframe forms the first soldering region and a second exposed region of the leadframe forms the second soldering region.

2. The assembly of claim 1, wherein the separating web has a width (B1) that corresponds at least to a width (B2) of the shortened dummy output terminals.

3. The assembly of claim 1, wherein the separating web has a height (H) which is selected to be at least high enough that a solder applied to the soldering regions cannot spill over in the viscous state.

4. The assembly of claim 1, wherein the circuit board comprises a support region that is separated from the first and second soldering region by another separating web.

5. The assembly of claim 4, wherein a large-area cooling layer is arranged on an underside of the housing, which layer is thermally coupled to components arranged in the housing and is also electrically, mechanically or electrically and mechanically fastened to the support region so as to dissipate heat generated by the components during operation.

6. The assembly of claim 1, wherein the circuit board comprises a leadframe, and wherein the separating webs are produced by overmoulding the leadframe using a plastics material.

7. The assembly of claim 1, wherein the soldering regions are dimensioned such that the control terminal can be placed on and fastened to the first soldering region by its support surface and the output terminals can be placed on and fastened to the second soldering region by their support surfaces.

8. The assembly of claim 1, wherein an SMD housing is provided as a housing type for surface mounting the power semiconductor component.

9. The assembly of claim 1, wherein the power semiconductor component comprises at least one power switch as a component.

10. The assembly of claim 1, wherein a plurality of components are provided in the housing which, on the control side, can each be simultaneously actuated by the shared control terminal and are connected in parallel in terms of the load outputs thereof.

11. The assembly of claim 1, wherein a single control terminal is provided which is arranged on an outer side as a housing.

12. The assembly of claim 4, wherein also the support region is a component of the leadframe.

13. The assembly of claim 9, wherein the power switch is a power MOSFET, IGBT or thyristor.

14. Control device for a cooling fan module of a motor vehicle, comprising a circuit board assembly, the circuit board assembly comprising:
- a circuit board which comprises a first soldering region and a second soldering region that is galvanically isolated therefrom and further comprises a separating web which is arranged between the soldering regions and is raised up from the soldering regions,
- a power semiconductor component, which comprises a housing having an output terminal side, from which at least one control terminal and a plurality of output terminals which are arranged substantially beside one another on the output terminal side project, the control terminal being connected to the first soldering region and the output terminals being connected to the second soldering region, and the control terminal being separated from the output terminals by the raised separating web,
- wherein at least one dummy output terminal is provided which is shortened compared with the output terminals and is decoupled from the second soldering region, wherein the dummy output terminals are arranged so as to be adjacent to the control terminals and in the region of the separating web,
- wherein the circuit board comprises a leadframe, and wherein a first exposed region of the leadframe forms the first soldering region and a second exposed region of the leadframe forms the second soldering region.

15. A method for mounting a power semiconductor component on a circuit board comprising the steps of:
- providing a circuit board which comprises a first soldering region and a second soldering region that is galvanically isolated therefrom, and a power semiconductor component, which comprises a housing having an output terminal side, from which at least one control terminal and a plurality of output terminals which are arranged substantially beside one another project, wherein the circuit board comprises a leadframe, and wherein a first exposed region of the leadframe forms the first soldering region and a second exposed region of the leadframe forms the second soldering region;
- producing a separating web which is raised up from a surface of the soldering regions between the two soldering regions;
- cutting off an output terminal adjacent to the control terminal to produce a dummy output terminal;
- positioning the power semiconductor component on the circuit board such that control terminal rests on the first soldering region, the output terminals rest on the second soldering region and the cut-off dummy output terminal is in the region of the separating web, wherein the dummy output terminals are arranged so as to be adjacent to the control terminals;
- soldering the control terminal to the first soldering region and soldering the output terminals to the second soldering region.

* * * * *